(12) United States Patent
Oba et al.

(10) Patent No.: US 10,605,688 B2
(45) Date of Patent: Mar. 31, 2020

(54) LOAD CELL INPUT UNIT

(71) Applicant: OMRON Corporation, Kyoto (JP)

(72) Inventors: Hitoshi Oba, Kameoka (JP); Hiroki Miyake, Kyoto (JP)

(73) Assignee: OMRON Corporation, Kyoto (JP)

( * ) Notice: Subject to any disclaimer, the term of this patent is extended or adjusted under 35 U.S.C. 154(b) by 366 days.

(21) Appl. No.: 15/375,172

(22) Filed: Dec. 12, 2016

(65) Prior Publication Data

US 2017/0219452 A1   Aug. 3, 2017

(30) Foreign Application Priority Data

Jan. 29, 2016   (JP) ................... 2016-016347

(51) Int. Cl.
| | |
|---|---|
| *G01L 27/00* | (2006.01) |
| *G01L 1/22* | (2006.01) |
| *G01R 31/02* | (2006.01) |
| *G01R 31/04* | (2006.01) |
| *G01G 3/13* | (2006.01) |
| *G01G 23/01* | (2006.01) |

(52) U.S. Cl.
CPC ............. *G01L 27/007* (2013.01); *G01L 1/22* (2013.01); *G01R 31/026* (2013.01); *G01G 3/13* (2013.01); *G01G 23/01* (2013.01); *G01R 31/041* (2013.01)

(58) Field of Classification Search
CPC ....... G01L 27/007; G01L 1/22; G01R 31/026; G01R 31/041; G01G 23/01; G01G 3/13
See application file for complete search history.

(56) References Cited

U.S. PATENT DOCUMENTS

| | | | | |
|---|---|---|---|---|
| 5,031,463 A | * | 7/1991 | Hess | .......... G01B 7/18 |
| | | | | 73/766 |
| 2008/0143298 A1 | * | 6/2008 | Yoshida | ............ G01R 31/3658 |
| | | | | 320/136 |
| 2016/0018254 A1 | | 1/2016 | Wechselberger et al. | |
| 2017/0098048 A1 | * | 4/2017 | Brosnan | ................. G05B 15/02 |

FOREIGN PATENT DOCUMENTS

| | | |
|---|---|---|
| CN | 1111750 | 11/1995 |
| CN | 1821726 | 8/2006 |
| CN | 101607542 | 12/2009 |
| CN | 103930757 | 7/2014 |
| CN | 203786498 | 8/2014 |

(Continued)

OTHER PUBLICATIONS

"Search Report of Europe Counterpart Application", dated Jun. 16, 2017, p. 1-p. 6.

(Continued)

*Primary Examiner* — Peter J Macchiarolo
*Assistant Examiner* — John M Royston
(74) *Attorney, Agent, or Firm* — JCIPRNET

(57) ABSTRACT

A load cell input unit capable of determining whether load cell connection cables have a broken line is provided. When the load cell input unit (30) is in a broken line detection mode, a voltage applying element (311) applies a voltage to distribution lines of an amplifying element (31), and a broken line determination element (33) determines whether the load cell connection cables (40) have a broken line based on a voltage measured by a load measuring element (32).

8 Claims, 7 Drawing Sheets

(56) References Cited

FOREIGN PATENT DOCUMENTS

| | | |
|---|---|---|
| JP | S57166131 | 10/1982 |
| JP | 2005156193 | 6/2005 |
| JP | 2006242699 | 9/2006 |
| JP | 2013007572 | 1/2013 |
| JP | 2013036863 | 2/2013 |
| JP | 2014-153234 | 8/2014 |
| WO | 2012025999 | 3/2012 |
| WO | 2016055017 | 4/2016 |

OTHER PUBLICATIONS

"Office Action of Japan Counterpart Application," dated Jun. 19, 2018, with English translation thereof, p. 1-p. 11.
Office Action of China Counterpart Application, with English translation thereof, dated Nov. 14, 2018, pp. 1-14.

* cited by examiner

Broken line
< diagnosis table >

| State of the cable | Cables with the broken line | Reference voltage (V) | | | |
|---|---|---|---|---|---|
| | | V1 | V2 | V3 | V4 |
| Normal (no broken line) | None | 2.336175 | 2.33618 | 5.1915 | 0.00 |
| Abnormal (with a broken line) | Only SIG+ | 5.375 | 2.33618 | 5.1915 | 0.00 |
| | Only SIG- | 2.336175 | 0.00 | 5.1915 | 0.00 |
| | Only S+ | 2.336175 | 2.33618 | 0.00 | 0.00 |
| | Only S- | 2.336175 | 2.33618 | 5.1915 | 5.38 |
| | Only EXC+ | 0.00 | 0.00 | 0.00 | 0.00 |
| | Only EXC- | 5.1915 | 5.1915 | 5.1915 | 5.1915 |
| | SIG+ and SIG- | ⋮ | ⋮ | ⋮ | ⋮ |
| | ⋮ | ⋮ | ⋮ | ⋮ | ⋮ |

FIG.4

LOAD CELL INPUT UNIT

CROSS-REFERENCE TO RELATED APPLICATION

This application claims the priority benefit of Japan application serial no. 2016-016347, filed on Jan. 29, 2016. The entirety of the above-mentioned patent application is hereby incorporated by reference herein and made a part of this specification.

BACKGROUND OF THE INVENTION

Field of the Invention

The invention relates to a load cell input unit adapted to measure a load of a load cell.

Description of Related Art

FIG. 6 is a diagram illustrating a flow of measuring a load by a conventional measuring system including a load cell 10 and a load cell input unit 930. The load cell 10 is a sensor used for transforming a load of a measuring object into an electric signal. The electric signal (i.e. input signal) output by the load cell 10 is input to the load cell input unit 930. The load cell input unit 930 calculates a weight or pressure according to the input signal, and outputs an output signal containing information of the calculated value to a host equipment 100 (i.e. an external control device) through an Ethernet for control automation technology (EtherCAT) coupler.

FIG. 7 is a structural diagram of a conventional measuring system 900. As shown in FIG. 7, the load cell 10 of the measuring system 900 includes a Wheatstone bridge circuit containing a strain gauge RL1 and three resistors RL2-RL4. Alternatively, the load cell 10 may have two or four strain gauges. An input signal EXC+ and an input signal EXC− are input to the load cell 10 from the load cell input unit 930. A Voltage of the input signal EXC+ and the input signal EXC− input to the load cell 10 is divided by the resistors RL2-RL4 and the strain gauge RL1. By applying a load to the load cell 10, a resistance of the strain gauge RL1 changes, and divided voltages of the resistors RL2-RL4 and the strain gauge RL1 also change. As a result, voltages of an electric signal SIG+ and an electric signal SIG− output from two output terminals of the load cell 10 change.

As shown in FIG. 7, the load cell input unit 930 has an amplifying element 931 and a load measuring element 32. The input signals input to the load cell input unit 930 from the load cell 10 are first input to the amplifying element 931 of the load cell input unit 930. The amplifying element 931 amplifies the input signals. Then, the input signals are input to the load measuring element 32. The load measuring element 32 calculates a weight or pressure, etc. according to the input signals. The load cell input unit 930 outputs an output signal containing information of a measured value such as the weight or the pressure to the post-stage host equipment 100 (referring to FIG. 6).

As shown in FIG. 7, the load cell 10 and the load cell input unit 930 are connected through six load cell connection cables 40. Two input terminals of the load cell 10 are respectively connected with two load cell connection cables 40. Moreover, two output terminals of the load cell 10 are respectively connected with one load cell connection cable 40. The two load cell connection cables 40 connected to the two input terminals of the load cell 10 are used for inputting the input signal EXC+ and the input signal EXC− to the load cell 10. Through other two load cell connection cables 40 that are connected to the two input terminals of the load cell 10, an electric signal S+ and an electric signal S− are input to the load cell input unit 930. Moreover, through the two load cell connection cables 40 connected to the two output terminals of the load cell 10, the electric signal SIG+ and the electric signal SIG− are input to the load cell input unit 930. The load measuring element 32 of the load cell input unit 930 calculates the weight or pressure, etc. based on the electric signal SIG+, the electric signal SIG−, the electric signal S+ and the electric signal S−.

EXISTING TECHNICAL LITERATURE

Patent Literature

Patent literature 1: Japan Patent publication No. 2014-153234 (published on Aug. 25, 2014)

SUMMARY OF THE INVENTION

Problem to be Resolved by the Invention

In the load cell input unit 930 shown in FIG. 7, in case one or more load cell connection cables 40 are broken, the voltages of the input signals of the load cell input unit 930 are changed to values different from the voltages of the input signals of the load cell input unit 930 when the load cell connection cables 40 are not broken. As a result, the load measuring element 32 of the load cell input unit 930 cannot correctly calculate the value of the load (weight or pressure) based on the input signals. In this case, in order to identify the cause of failure, a user has to perform troubleshooting of the measuring system 900. However, following problems are encountered: troubleshooting of the measuring system 900 requires a huge amount of time, and the user has to spend a large labor.

The invention is directed to a load cell input unit capable of diagnosing whether load cell connection cables have a broken line.

Technical Means for Resolving the Problem

In order to resolve the aforementioned problem, the invention provides a load cell input unit to measure a load of a load cell, and the load cell input unit includes two applying voltage input terminals for inputting an applying voltage value to the load cell; two output voltage input terminals for inputting an output voltage value coming from the load cell; a load measuring element for measuring the load based on the voltage values inputted to the applying voltage input terminals and the output voltage input terminals; a voltage applying element for respectively applying a specified voltage to distribution lines, where the distribution lines respectively connect the two applying voltage input terminals and the two output voltage input terminals with the load measuring element; a mode switching element for switching a mode of the load cell input unit between (i) a measuring mode for measuring the load, and (ii) a broken line detection mode for detecting broken lines of connection cables connecting the load cell and the load cell input unit based on an external instruction; a broken line determination element for determining whether a measuring result obtained by the load measuring element is within a proper range when the load cell input unit is in the broken line detection mode and the voltage applying element applies the specified voltage to the distribution lines, so as to determine whether the connection cables have a broken line.

According to the above structure, in case that a voltage is applied to the distribution lines, a measurement equivalent to the measurement of the load is performed to determine whether the connection cable is broken. Therefore, whether the connection cable is broken can be detected without using, for example, a tester, etc.

In an embodiment of the invention, the proper range is the measuring result of the load measuring element in case that the connection cables have no broken line.

According to the above structure, the value of the proper range can be simply formed, and whether the connection cables have a broken line can be simply determined.

In an embodiment of the invention, the broken line determination element determines whether the connection cables have a broken line during a period that an object installed with the load cell is in operation and the load is not applied to the load cell.

According to the above structure, during the period that the object is in operation and the load is not applied to the load cell, whether the cable lines have a broken line can be determined. Therefore, compared to a structure that only makes a broke line determination during the period that the object does not operate, a frequency of the broken line determination is raised.

In an embodiment of the invention, the voltage applying element applies the specified voltage to the distribution lines in case that the load cell input unit is in the broken line detection mode. On the other hand, the voltage applying element does not apply the specified voltage to the distribution lines in case that the load cell input unit is in the measuring mode.

According to the above structure, when the load of the load cell is measured, the load cell input unit can be set to the measuring mode that does not apply the specified voltage to the distribution lines. In case that the load cell input unit is in the measuring mode, current may not be leaked from the distribution lines through the voltage applying element. Therefore, before the load of the load cell is measured, the external control device pre-switches the load cell input unit to the measuring mode, so as to improve measurement accuracy.

In an embodiment of the invention, the mode switching element switches a mode of the load cell input unit between the measuring mode and the broken line detection mode based on an instruction of the external control device.

According to the above structure, the external control device may control mode switching of the load cell input unit.

In an embodiment of the invention, the load cell input unit further includes a sending element for sending a determination result of the broken line determination element that determines whether the broken line exists to the external control device based on instruction of the external control device.

According to the above structure, the determination result for determining whether the broken line exists can be sent to the external control device.

In an embodiment of the invention, the load cell input unit further includes a storage element for storing the determination result of the broken line determination element that determines whether the broken line exists as a flag, and the storage element is adapted to be accessed by the external control device for reading the flag.

According to the above structure, the external control device may read the flag of the storage element to determine whether the connection cables have the broken line.

In an embodiment of the invention, the load cell input unit further includes an input receiving element for receiving an input of a user, and the broken line determination element performs the broken line determination based on an instruction received by the input receiving element from the user.

According to the above structure, the broken line determination can be performed through user's operation, so that when the user experiences abnormalities, the user may immediately determines whether the broken line exists.

In an embodiment of the invention, the load cell input unit further includes a broken line notification element for notifying the situation that the connection cables have the broken line when the broken line determination element determines that the connection cables have the broken line.

According to the above structure, the user may learn the situation that the connection cables have the broken line through notification, so as to take repairing or other corresponding measures.

Effect of the Invention

The invention provides a load cell input unit capable of diagnosing whether load cell connection cables have a broken line.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4 is a diagram of a broken line diagnosis table referred by a broken line determination element of the measuring system of the embodiment 1.

DESCRIPTION OF EMBODIMENTS

Embodiment 1

The embodiment of the invention is described below with reference of FIG. 1 to FIG. 4.

(Measuring System 1)

Figure 2:
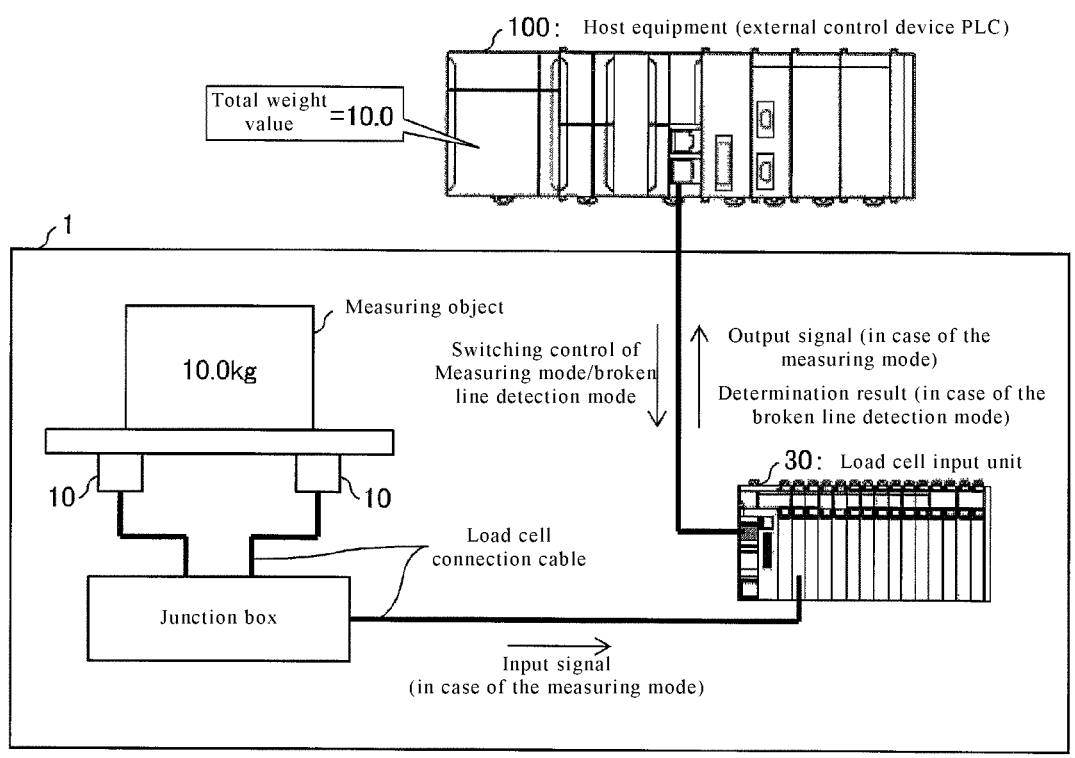
FIG. 2 is a structural diagram of the measuring system 1 according to the embodiment 1 of the invention.

FIG. 2 is a structural diagram of the measuring system 1 according to the embodiment 1 of the invention. As shown in FIG. 2, the measuring system 1 has a load cell 10 and a load cell input unit 30. The load cell input unit 30 is controlled by a programmable logic controller (PLC) of an external control device serving as host equipment 100 of the measuring system 1. The load cell 10 outputs an electric signal to the load cell input unit 30. The load cell input unit 30 calculates a load of a measuring object according to the electric signal input from the load cell 10. The load cell input unit 30 sends information of a measuring value of the load of the measuring object to the host equipment 100. Moreover, the load cell input unit 30 is not only adapted to the measuring system 1, but also adapted to a quantitative cut-out control system or a press-in system. The quantitative cut-out control system is a system adapted to measure a weight of a material, and expel the material of a specified weight to a container, and the press-in system is a system adapted to apply a specified load to one part on one hand and press in another part on the other hand, so as to bond the two parts.

The load cell input unit 30 has a broken line detection mode and a measuring mode. As described later, based on an instruction coming from the host equipment 100, etc., the load cell input unit 30 is switched from the measuring mode to the broken line detection mode. In case that the load cell input unit 30 is in the broken line detection mode, it is determined whether load cell connection cables 40 (connection cables) (referring to FIG. 1) have a broken line. On the other hand, in case that the load cell input unit 30 is in the measuring mode, the load of the measuring object is measured. Even during a period that the load cell 10 is running on line, as long as the load is not applied to the load sensor, the load cell input unit 30 may diagnose whether the load cell connection cables 40 have a broken line without stopping operation of the line.

(The Load Cell Input Unit 30)

Figure 1:
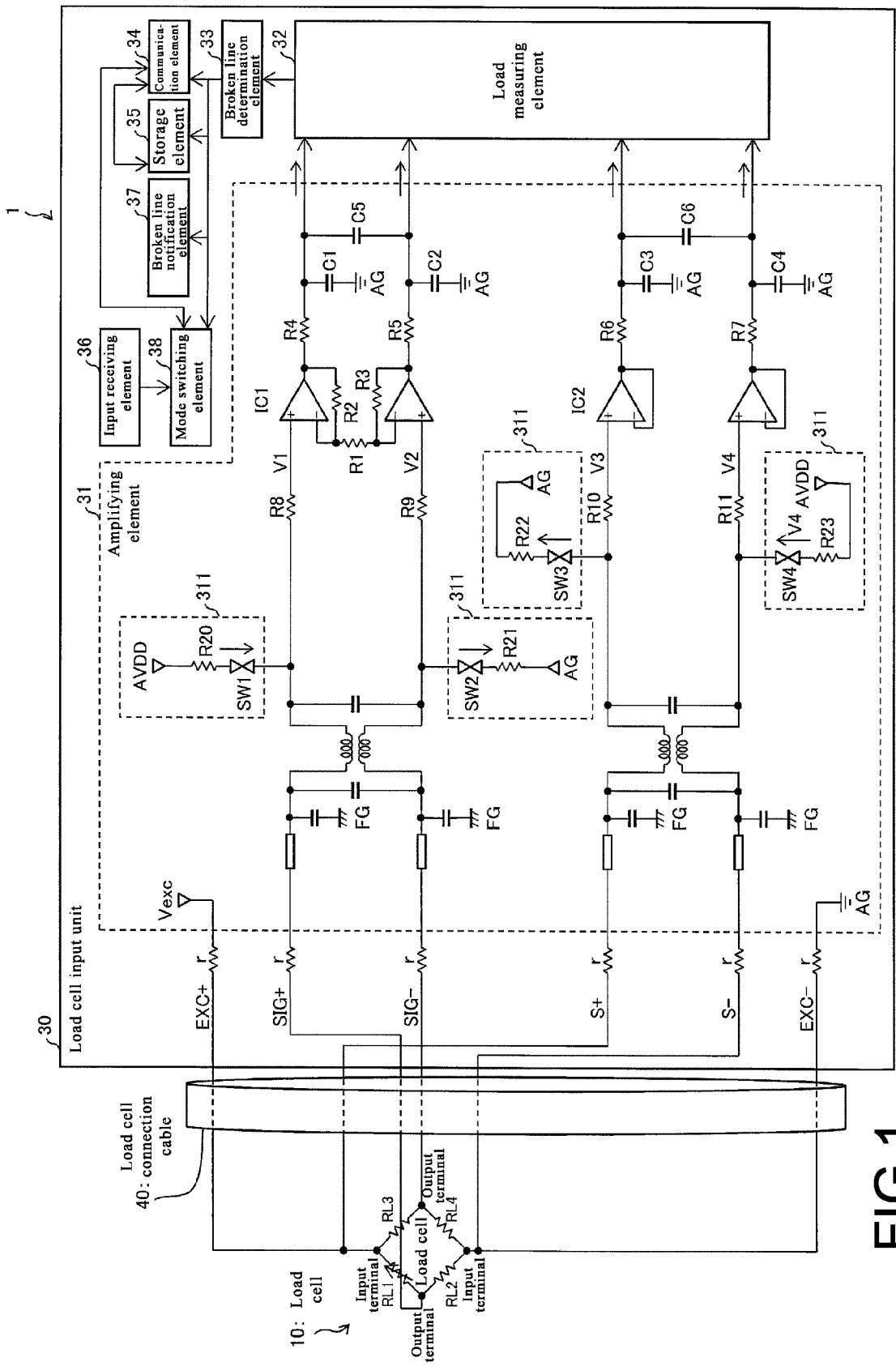
FIG. 1 is a circuit diagram of a measuring system 1 according to an embodiment 1 of the invention.

FIG. 1 is a circuit diagram of the measuring system 1 according to the embodiment 1 of the invention. The measuring system 1 includes the load cell input unit 30 and the load cell 10. As shown in FIG. 1, besides an amplifying element 31 and a load measuring element 32, the load cell input unit 30 of the present embodiment further includes a broken line determination element 33, a communication element 34 (a sending element), a storage element 35, an input receiving element 36, a broken line notification element 37 and a mode switching element 38. Moreover, the load cell input unit 30 communicates with the host equipment 100 shown in FIG. 2 through the communication element 34. The communication element 34 is, for example, also adapted to the EtherCAT protocol.

As shown in FIG. 1, the load cell 10 and the load cell input unit 30 are connected through six load cell connection cables 40. An input signal EXC+ and an input signal EXC− are input (a voltage is applied) to the load cell 10 from the load cell input unit 30 through two load cell connection cables 40 (referred to as a cable EXC+ and a cable EXC− hereinafter). Moreover, an electric signal S+ and an electric signal S− are input to the amplifying element 31 of the load cell input unit 30 through two load cell connection cables 40 (referred to as a cable S+ and a cable S− hereinafter) connected to two input terminals (applying voltage input terminals) of the load cell 10. An electric signal SIG+ and an electric signal SIG− (output voltage value) are input to the amplifying element 31 of the load cell input unit 30 through two load cell connection cables 40 (referred to as a cable SIG+ and a cable SIG− hereinafter) connected to two output terminals (output voltage input terminals) of the load cell 10. The load measuring element 32 of the load cell input unit 30 calculates the load of the measuring object according to the electric signal SIG+, the electric signal SIG−, the electric signal S+ and the electric signal S−.

Figure 7:
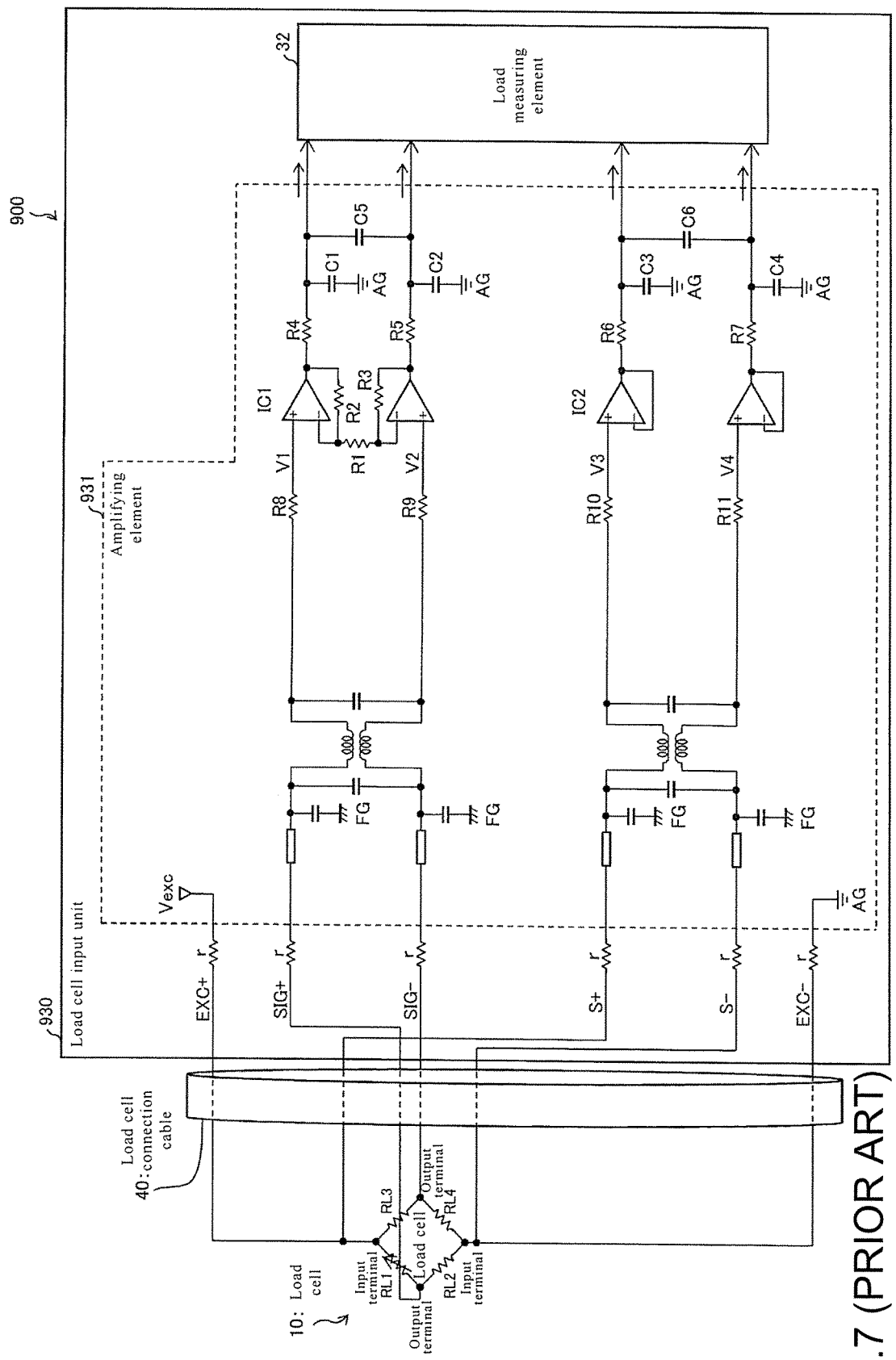
FIG. 7 is a structural diagram of a conventional measuring system.

Besides the structure of the amplifying element 931 shown in FIG. 7, the amplifying element 31 further includes a voltage applying element 311. The voltage applying element 311 is configured close to an input side of the amplifying element 31 (the side of the amplifying element 31 connected to the load cell connection cables 40) compared to operational amplifiers of the amplifying element 31. The voltage applying element 311 applies a specified voltage to distribution lines of the amplifying element 31 when (i) the measuring system 1 is in the broken line detection mode, and (ii) the load is not applied to the load cell 10. Moreover, the voltage applying element 311 includes switches SW1-SW4. When the switches SW1-SW4 are turned on, the voltage applying element 311 applies the specified voltage to the distribution lines of the amplifying element 31. When the measuring system 1 is in the broken line detection mode, the switches SW1-SW4 are in an ON state. Moreover, when the measuring system 1 is in the measuring mode, the switches SW1-SW4 are in an OFF state. Therefore, in the measuring mode, no current flows into the distribution lines of the voltage applying part 311. Therefore, the load cell input unit 30 may measure the load of the load cell 10 under the same condition as a structure without the voltage applying element 311. Moreover, on/off of the switches SW1-SW4 is switched by the mode switching element 38.

When the load cell connection cables 40 do not have a broken line, in case that the voltage applying element 311 applies a voltage to the distribution lines of the amplifying element 31, currents flow from the voltage applying element 311 to the load cell connection cables 40 and resistors R8-R11. On the other hand, when the load cell connection cables 40 have a broken line, in case that the voltage applying element 311 applies the voltage to the distribution lines of the amplifying element 31, no current flows to the load cell connection cables 40, and the currents only flow from the voltage applying element 311 to the resistors R8-R11. Therefore, in case that the load cell connection cables 40 have a broken line, compared to the situation that the load cell connection cables 40 do not have the broken line, values of reference voltages V1-V4 applied to the resistors R8-R11 are varied.

When (i) the load is not applied to the load cell 10, and (ii) the voltage applying element 311 applies voltage to the distribution lines of the amplifying element 31, the broken line determination element 33 determines whether the six load cell connection cables 40 have a broken line based on the reference voltages V1-V4 output from the amplifying element 31. To be specific, the broken line determination element 33 first respectively determines whether each of the reference voltages V1-V4 has an abnormal value or a normal value (a value within a proper range). Then, the broken line determination element 33 determines the load cell connection cables 40 with broken line based on a combination of the reference voltages V1-V4 with abnormal values by referring to a broken line diagnosis table (referring to FIG. 4). The normal values of the reference voltages V1-V4 refer to values of the reference voltages V1-V4 obtained when the six load cell connection cables 40 have no broken line. Moreover, the abnormal values of the reference voltages V1-V4 refer to values deviating from the normal values of the reference voltages V1-V4 (exceeding an error range). Data of the normal values can be stored in the storage element 35. The host equipment 100 may access the data stored in the storage element 35.

The broken line determination element 33 produces a broken line status flag representing whether the load cell connection cables 40 have a broken line based on a diagnosis result of determining whether the load cell connection cables 40 have a broken line. Moreover, the broken line determination element 33 takes the produced broken line status flag as I/O data for storing in the storage element 35. The host equipment 100 may read the broken line status flag stored in the storage element 35 of the load cell input unit 30 at any time through the communication element 34, so as to determine whether the load cell connection cables 40 have a broken line.

Moreover, in case that the broken line determination element 33 determines that the load cell connection cables 40 have a broken line, the broken line notification element 37 may notify the situation that the load cell connection cables 40 have the broken line. The broken line notification element 37 may send the notification by sending an alarm or lighting a lamp, etc.

(Mode Switch)

The host equipment 100 sends a command for determining whether the load cell connection cables 40 have a broken line to the mode switching element 38 of the load cell input unit 30. The mode switching element 38 switches the load cell input unit 30 to the broken line detection mode according to the command received from the host equipment 100 through the communication element 34. Alternatively, in case that the storage element 35 of the load cell input unit 30 stores a mode switching flag indicating whether to switch the load cell input unit 30 to the broken line detection mode, the host equipment 100 may rewrite the mode switching flag through the communication element 34. In such structure, the mode switching element 38 periodically refers to the mode switching flag stored in the storage element 35. Moreover, when the mode switching flag indicates that it is required to switch the load cell input unit 30 to the broken line detection mode, the mode switching element 38 switches the load cell input unit 30 to the broken line detection mode. Alternatively, the mode switching element 38 may switch the load cell input unit 30 to the broken line detection mode based on a user operation performed on the input receiving element 36.

As described above, the load cell input unit 30 executes a broken line diagnosis when it is switched to the broken line detection mode according to the command coming from the host equipment 100 or according to the mode switching flag, so that the load cell input unit 30 may self-diagnose whether the load cell connection cables 40 have a broken line without stopping operation of the production line.

(Variation of the Measuring System 1)

Figure 3A:
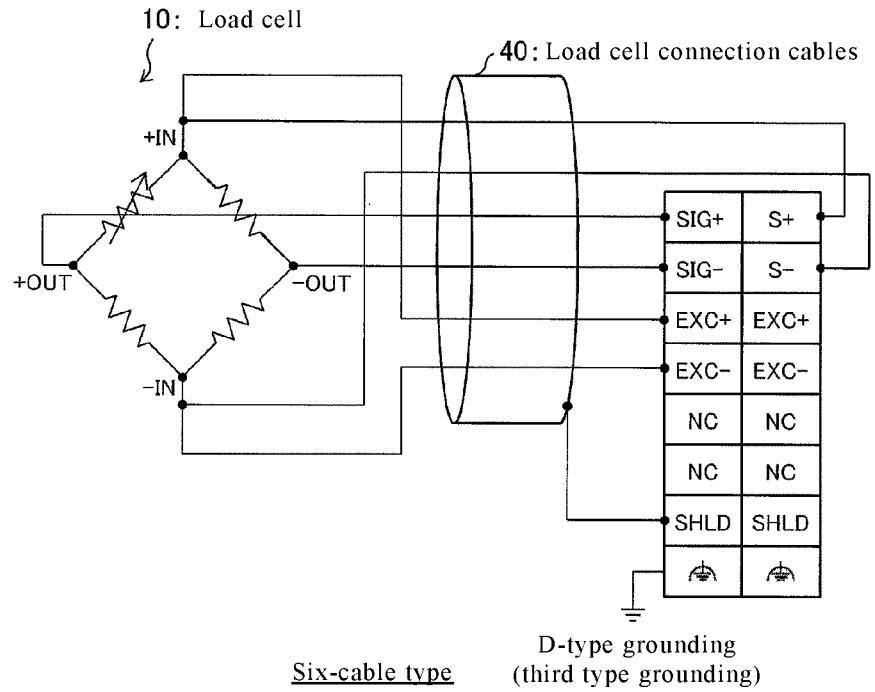
FIG. 3(*a*) is a diagram of a six-cable type measuring system, and FIG. 3(*b*) is a diagram of a four-cable type measuring system.
Figure 3B:
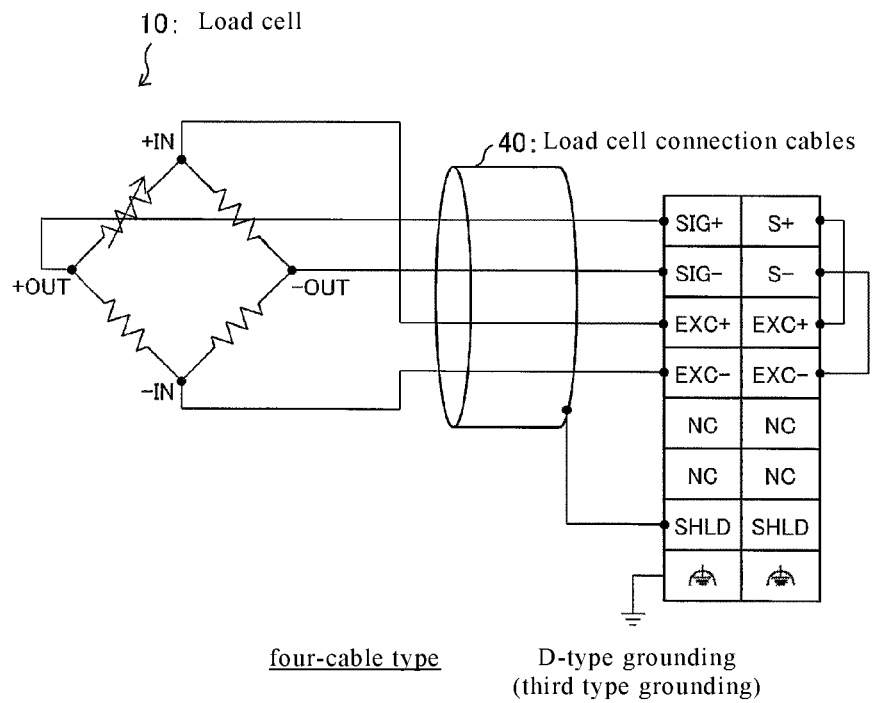

FIG. 3(a) is a diagram of a six-cable type measuring system, and FIG. 3(b) is a diagram of a four-cable type measuring system. As shown in FIG. 3(a), the six-cable type measuring system has six load cell connection cables. The measuring system 1 shown in FIG. 1 is the six-cable type measuring system. In the six-cable type measuring system, the electric signal S+ and the electric signal S− are adopted to replace the input signal EXC+ and the input signal EXC− to calculate the load. Voltages of the electric signal S+ and the electric signal S− is closer to the voltages actually applied to the input terminals of the load cell 10 compared to the voltages of the input signal EXC+ and the input signal EXC−. Therefore, the six-cable type measuring system has an advantage of capable of measuring the load in high accuracy and high stableness.

On the other hand, as shown in FIG. 3(b), the four-cable type measuring system has four load cell connection cables. In the four-cable type measuring system, two input terminals of the load cell are respectively connected to one load cell connection cable, and two output terminals of the load cell are respectively connected to one load cell connection cable. In a variation, as shown in FIG. 3(b), the measuring system 1 can be the four-cable type measuring system. The four-cable type measuring system has an advantage of low probability of broken line generation due to a less number of the load cell connection cables.

(Broken Line Diagnosis Table)

FIG. 4 is a diagram of a broken line diagnosis table referred by the broken line determination element 33 in order to determine whether the load cell connection cables 40 have a broken line. In the broken line diagnosis table of FIG. 4, the normal values (i.e. values of the reference voltages V1-V4 in case that none of the load cell connection cables is broken) are respectively V1=2.336175, V2=2.33618, V3=5.1915, V4=0.00. In FIG. 4, slash lines are used to represent the abnormal values of the reference voltages V1-V4).

As shown in FIG. 4, when only the cable SIG+ in the six load cell connection cables 40 is broken, the reference voltage V1 has the abnormal value (5.375). Moreover, when only the cable SIG− is broken, the reference voltage V2 has the abnormal value (0.00). When only the cable S+ is broken, the reference voltage V3 has the abnormal value (0.00). When only the cable S− is broken, the reference voltage V4 has the abnormal value (5.38). When only the cable EXC+ is broken, the reference voltages V1-V3 have the abnormal value. When only the cable EXC− is broken, the reference voltages V1, V2 and V4 have the abnormal value. Therefore, corresponding to the combination of the load cell connection cables 40 with broken line, at least one of the reference voltages V1-V4 has the abnormal value. Moreover, although not illustrated, when two or more load cell connection cables 40 are broken, at least one of the reference voltages V1-V4 has the abnormal value. The broken line determination element 33 refers to the broken line diagnosis table shown in FIG. 4. Moreover, when the reference voltages V1-V4 have the abnormal values, it is determined that the load cell connection cables 40 have broken line.

As described above, in case of the broken line detection mode, the load cell input unit 30 self-diagnoses whether the load cell connection cables 40 have broken line caused by "wiring error in boot up", or "running through stress", etc. Therefore, the number of times for performing troubleshooting during the boot up or running of the measuring system 1 can be decreased. Moreover, the load cell input unit 30 sends a diagnosis result of determining whether the broken line exists to the host equipment 100. When the host equipment 100 receives the diagnosis result indicating that the load cell connection cables 40 have broken line from the load cell input unit 30, the host equipment 100 may notify that the load cell connection cables 40 have broken line by sending an alarm or lighting a warning lamp.

Embodiment 2

Another embodiment of the invention is described below with reference of FIG. 5. Moreover, to facilitate description, referential numbers of the embodiment 1 are also used in the embodiment 2, wherein the same referential numbers denote the same or like components, and descriptions of the same technical contents are omitted.

In the embodiment 1, the structure that the voltage applying element 311 of the load cell input unit 30 has the switches SW1-SW4 is described. However, in the present embodiment, the switches of the voltage applying element are not necessary. Namely, the voltage applying element may not include the switches. In the present embodiment, a structure of a load cell input unit 230 including the voltage applying element 211 without the switches is described. According to the structure of the present embodiment, the structure of the voltage applying element can be simplified.

Figure 5:
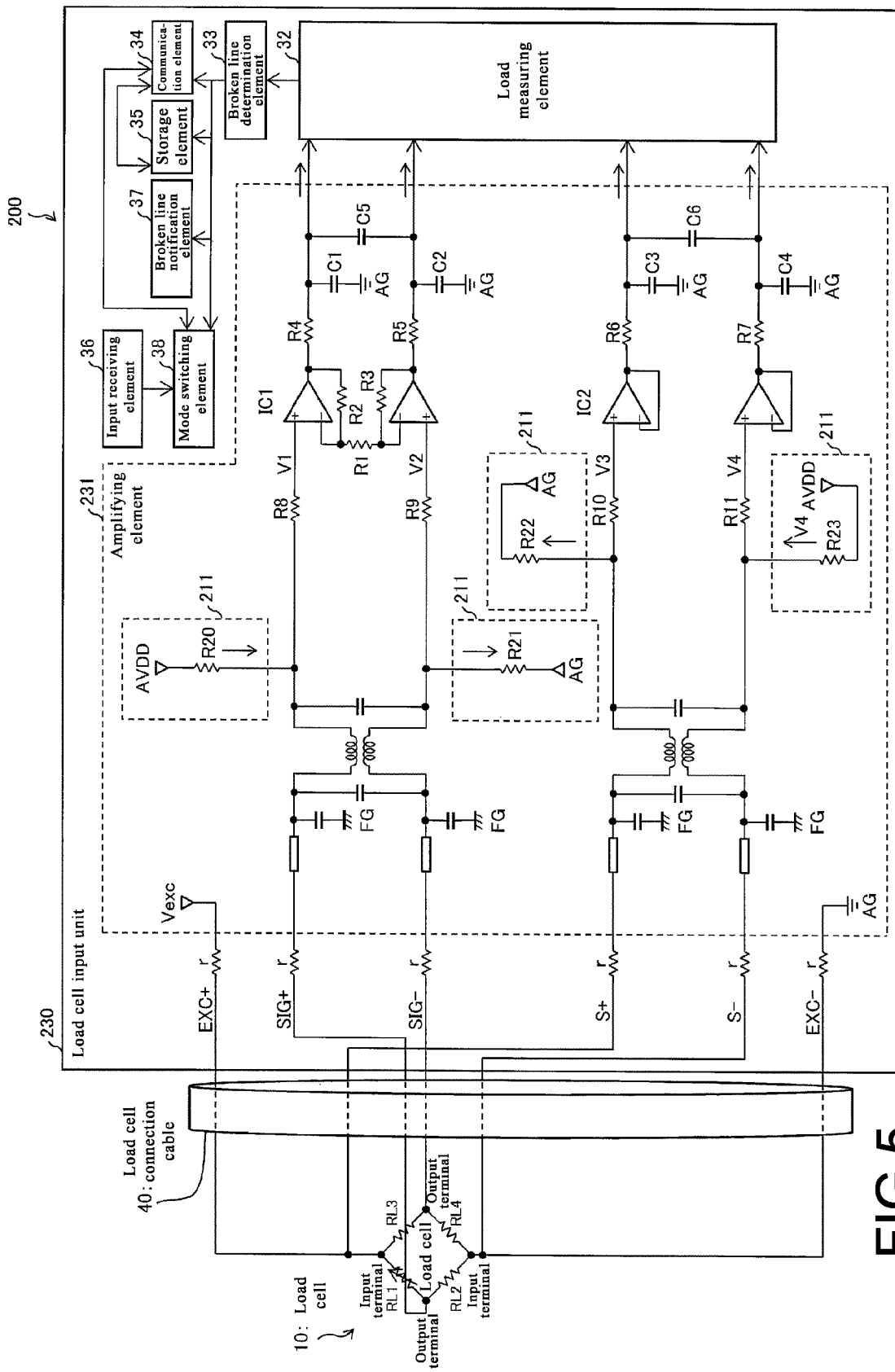
FIG. 5 is a circuit diagram of a measuring system of an embodiment 2.
Figure 6:
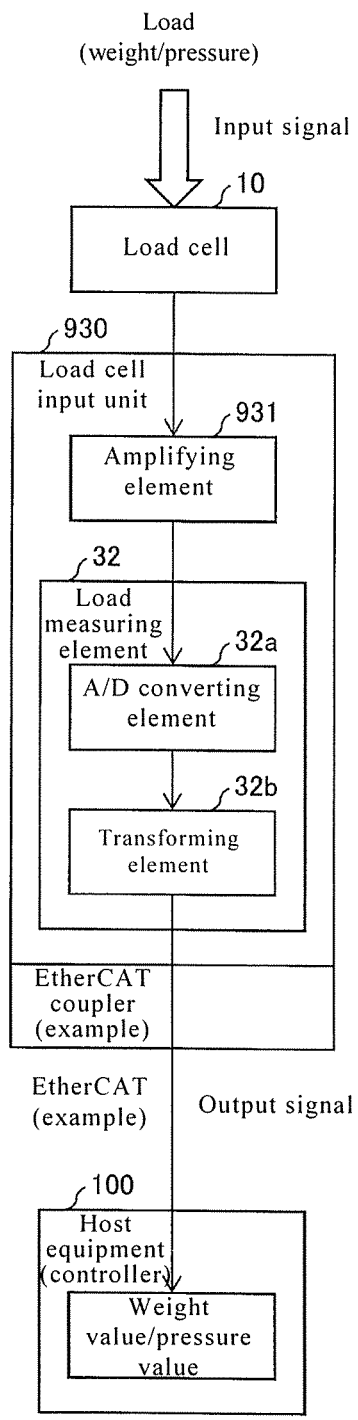
FIG. 6 is a diagram illustrating a flow of measuring a load by a conventional measuring system including a load cell and a load cell input unit.

FIG. 5 is a circuit diagram of a measuring system 200 of the present embodiment. The load cell input unit 230 of the measuring system 200 has an amplifying element 231 for replacing the amplifying element 31. Moreover, the structures of other components besides the amplifying element 231 of the load cell input unit 230 are the same with the structures of other components besides the amplifying element 31 of the load cell input unit 30.

Besides the structure of the amplifying element 931 shown FIG. 7, the amplifying element 231 further has a voltage applying element 211. A difference between the structure of the voltage applying element 211 and the structure of the voltage applying element 311 of the embodiment 1 is that the voltage applying element 211 does not have the switches SW1-SW4. The voltage applying element 211 is configured close to an input side of the amplifying element 231 (i.e. the side of the amplifying element 231 connected to the load cell connection cables 40) compared to operational amplifiers of the amplifying element 231. The voltage applying element 211 applies a specified voltage to the distribution lines of the amplifying element 231 in case that the load is not applied to the load cell 10.

When the load cell connection cables 40 does not have broken line, in case that the voltage applying element 211 applies a voltage to the distribution lines of the amplifying element 231, currents flow from the voltage applying element 211 to the load cell connection cables 40 and resistors R8-R11. On the other hand, when the load cell connection cables 40 have a broken line, in case that the voltage applying element 311 applies the voltage to the distribution lines of the amplifying element 231, no current flows to the load cell connection cables 40, and the currents only flow from the voltage applying element 211 to the resistors R8-R11. Therefore, in case that the load cell connection cables 40 have the broken line, compared to the situation that the load cell connection cables 40 do not have the broken line, values of reference voltages V1-V4 applied to the resistors R8-R11 are varied.

Embodiment 3: Implementation Through Software

Control modules (especially the amplifying element 31, the load measuring element 32 and the broken line determination element 33) of the load cell input unit 30 can be implemented by logic circuits (hardware) formed on an integrated circuit (IC (chip)), and can also be implemented by using a central processing unit (CPU) through software.

In the later case, the load cell input unit 30 has a CPU adapted to execute commands of software (i.e. programs) capable of implementing various functions, a read only memory (ROM) or a storage device (referred to as a recording medium) recording the programs and various data that can be read by a computer (or the CPU), a random access memory (RAM) for spreading the programs, etc. Moreover, the programs recorded in the recording medium can be read and executed by the computer (or the CPU) to achieve the purpose of the invention. The recording medium can be implemented by a non-temporary physical medium, for example, a tape, a disk, a card, a semiconductor memory, a programmable logic circuit, etc. Moreover, the program can be provided to the computer through any transmission medium (a communication network or a radio wave, etc.) capable of transmitting the program. In addition, the data embodying the program and embedded in carriers can be implemented in form of signals through teletransmission.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A load cell input unit, adapted to measure a load of a load cell, the load cell input unit comprising:
two applying voltage input terminals, inputting applying voltage values to the load cell;
two output voltage input terminals, inputting output voltage values coming from the load cell;
a load measuring element, measuring the load based on the applying voltage values and the output voltage values respectively inputted to the applying voltage input terminals and the output voltage input terminals;
a voltage applying element, configured on a first side of a plurality of connection cables different from a second side of the connection cables to which the load cell is configured on, respectively applying a specified voltage to distribution lines and to the connection cables from the first side to the second side, wherein the distribution lines respectively connect the two applying voltage input terminals and the two output voltage input terminals with the load measuring element;
a mode switching element, switching a mode of the load cell input unit between (i) a measuring mode for measuring the load, and (ii) a broken line detection mode for detecting broken lines of the connection cables connecting the load cell and the load cell input unit based on an external instruction; and
a broken line determination element, determining whether a measuring result obtained by the load measuring element is within a proper range when the load cell input unit is in the broken line detection mode and the voltage applying element applies the specified voltage to the distribution lines, so as to determine whether the connection cables have a broken line,
wherein the proper range is determined by the measuring result of the load measuring element in case that the connection cables have no broken line.

2. The load cell input unit as claimed in claim 1, wherein the broken line determination element determines whether the connection cables have the broken line during a period that an object installed with the load cell is in operation and the load is not applied to the load cell.

3. The load cell input unit as claimed in claim 1, wherein the voltage applying element applies the specified voltage to the distribution lines in case that the load cell input unit is in the broken line detection mode, and the voltage applying element does not apply the specified voltage to the distribution lines in case that the load cell input unit is in the measuring mode.

4. The load cell input unit as claimed in claim 1, wherein the mode switching element switches the load cell input unit between the measuring mode and the broken line detection mode based on an instruction of an external control device.

5. The load cell input unit as claimed in claim 1, further comprising:
a sending element, sending a determination result of the broken line determination element that determines whether the broken line exists to an external control device based on the instruction of the external control device.

6. The load cell input unit as claimed in claim 1, further comprising:
a storage element, storing the determination result of the broken line determination element that determines whether the broken line exists as a flag, wherein the storage element is adapted to be accessed by an external control device for reading the flag.

7. The load cell input unit as claimed in claim 1, further comprising:
an input receiving element, receiving an input of a user, wherein the broken line determination element performs broken line determination based on an instruction received by the input receiving element from the user.

8. The load cell input unit as claimed in claim 1, further comprising:
a broken line notification element, notifying a situation that the connection cables have the broken line when the broken line determination element determines that the connection cables have the broken line.

* * * * *